(12) United States Patent
VB et al.

(10) Patent No.: US 8,305,080 B2
(45) Date of Patent: Nov. 6, 2012

(54) POWER SUPPLY FOR MAGNETIC RESONANCE IMAGING SYSTEM

(75) Inventors: Sriram VB, Bangalore (IN);
Jayasankar Venugopal, Bangalore (IN);
Pradeep P, Bangalore (IN);
Muralidhara SR, Bangalore (IN);
Venkatraman S, Bangalore (IN)

(73) Assignee: General Electric Company, Schenectady, NY (US)

( * ) Notice: Subject to any disclaimer, the term of this patent is extended or adjusted under 35 U.S.C. 154(b) by 422 days.

(21) Appl. No.: 12/751,507

(22) Filed: Mar. 31, 2010

(65) Prior Publication Data
US 2011/0241686 A1    Oct. 6, 2011

(51) Int. Cl.
*G01V 3/00*    (2006.01)

(52) U.S. Cl. ...................................................... 324/322

(58) Field of Classification Search ........... 324/300–322
See application file for complete search history.

(56) References Cited

U.S. PATENT DOCUMENTS

| | | | |
|---|---|---|---|
| 3,140,440 A * | 7/1964 | Senstad | 324/314 |
| 3,662,253 A | 5/1972 | Yamamoto | |
| 3,824,430 A * | 7/1974 | Hentschel | 361/23 |
| 4,348,558 A | 9/1982 | Johansson | |
| 4,622,513 A | 11/1986 | Stich | |
| 4,694,241 A | 9/1987 | Genuit | |
| 5,019,935 A * | 5/1991 | Nakamura | 361/45 |
| 5,604,424 A | 2/1997 | Shuttleworth | |
| 5,748,422 A * | 5/1998 | Heaston et al. | 361/18 |
| 5,862,044 A * | 1/1999 | Shioya et al. | 363/21.07 |
| 6,088,244 A * | 7/2000 | Shioya et al. | 363/21.07 |
| 7,145,760 B2 | 12/2006 | Stenestam et al. | |

* cited by examiner

*Primary Examiner* — Dixomara Vargas

(57) ABSTRACT

In one embodiment, a power supply for a static tap changer transformer is provided. The power supply comprises a rectifier section configured to supply input voltage, a latch circuit section coupled to the rectifier section and a tap changing section comprising three taps for each phase of three phase input power supply. The latch circuit section comprises a zener breakdown circuit with a selected breakdown voltage rating, an operational amplifier configured to activate the latch circuit section when the input voltage is higher than the selected breakdown voltage, a gate control device configured to generate a tap changing signal and thereby control the operation of the latch circuit section and a semi-conductor diode coupled to the gate control device and the operational amplifier, the semiconductor diode configured to provide the tap changing signal to the operational amplifier. Further, each tap in the tap changing section comprises a single MOSFET configured to act as a switch based on the output from the zener breakdown circuit and the gate control device.

20 Claims, 4 Drawing Sheets

POWER SUPPLY FOR MAGNETIC RESONANCE IMAGING SYSTEM

FIELD OF INVENTION

The invention generally relates to a magnetic resonance imaging apparatus and more particularly to a power supply device in a magnetic resonance imaging apparatus.

BACKGROUND OF THE INVENTION

Power supply for imaging systems are generally referred to as scan room power supplies. Prior art scan room power supply (SRPS) systems may include some form of protection network including voltage sensors to sense the voltage levels and turn the system down completely. A three-phase input power supply supplies power to the SRPS. Further, there are three MOSFETs per each phase and hence a minimum of three voltage sensors and an elaborate analog network is required with software interrupts to detect, communicate and shut down the imaging system.

The performance of the imaging system depends on MOSFET characteristics like avalanche breakdown ratings, which vary widely between MOSFETs. During dynamic turn ON the MOSFETs experience higher voltage level across the drain to source terminals based on the point on wave of the input sinusoidal waveform of the input supply. When this exceeds the absolute maximum voltage rating specification or the maximum avalanche voltage specification, the MOSFETs typically fail.

Failure of the MOSFETs in SRPS happens even under phase loss condition, which is absence of a single phase out of the three-phase supply that supplies power to the SRPS. Invariably, the control power is derived from one of the three phases. If this phase is lost, then the control power is lost which leads to the MOSFETs never getting turned ON. This leads to the MOSFETs experiencing the full level supply voltage. The capability of the MOSFET to survive under these conditions is solely dependant on the avalanche voltage specifications, which is a short time rating for the MOSFET. When the voltage across the MOSFET exceeds the avalanche voltage specification, the MOSFET may fail resulting in failure of the SRPS thereby causing unnecessary system downtime in MR scanning leading to patient discomfort.

Several solutions have been suggested in the prior art. One of the solutions describes using overvoltage sensors and overvoltage analog circuitry. However, the overvoltage sensors and the overvoltage analog circuitry consume significant board space while being economically disadvantageous.

Another prior art describes using snubber circuits to protect the MOSFETs from turn off overvoltage. The disadvantage associated with using the snubber circuits is the snubber circuits may prevent MOSFET failure but cannot prevent system downtime.

Further, in the prior art systems, during turn off due to the overvoltage across the MOSFET, the power dissipation due to the turn off loss is higher, mandating MOSFETs with high power dissipation capacities. This requires higher investment in heat sink and MOSFETs.

Hence there exists a need for a power supply for a magnetic resonance imaging system that prevents MOSFET failure and thereby prevents unnecessary system downtime during MR scanning.

BRIEF DESCRIPTION OF THE INVENTION

The above-mentioned shortcomings, disadvantages and problems are addressed herein which will be understood by reading and understanding the following specification.

In one embodiment, a power supply for a static tap changer transformer is provided. The power supply comprises a rectifier section configured to supply input voltage, a latch circuit section coupled to the rectifier section and a tap changing section comprising three taps for each phase of three phase input power supply. The latch circuit section comprises a zener breakdown circuit with a selected breakdown voltage rating, an operational amplifier configured to activate the latch circuit section when the input voltage is higher than the selected breakdown voltage, a gate control device configured to generate a tap changing signal and thereby control the operation of the latch circuit section and a semi-conductor diode coupled to the gate control device and the operational amplifier, the semiconductor diode configured to provide the tap changing signal to the operational amplifier. Further, each tap in the tap changing section comprises a single MOSFET configured to act as a switch based on the output from the zener breakdown circuit and the gate control device.

In another embodiment, an MRI system comprising a scan room power supply is provided. The scan room power supply comprises a latch circuit section comprising a zener breakdown circuit with a selected breakdown voltage rating, an operational amplifier coupled to the zener breakdown circuit, the operational amplifier configured to latch on an overvoltage condition, a gate control device for supplying control power to the latch circuit section and a semi-conductor diode coupled to the gate control device and the operational amplifier, the semi-conductor diode configured to provide the control power from the gate control device to the operational amplifier.

Systems and methods of varying scope are described herein. In addition to the aspects and advantages described in this summary, further aspects and advantages will become apparent by reference to the drawings and with reference to the detailed description that follows.

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The invention relates to a power supply for a Magnetic Resonance Imaging (MRI) system. The power supply provides power to various RF subsystems including RF hub and transient detection module (TDM) in the MRI system. The power supply ensures that the supplies to these are within the specified range of voltages and current for their desired operation, during scans performed using the MR system. The embodiments described herein improve the reliability of the power supply and allow fault tolerant operation.

Figure 1:
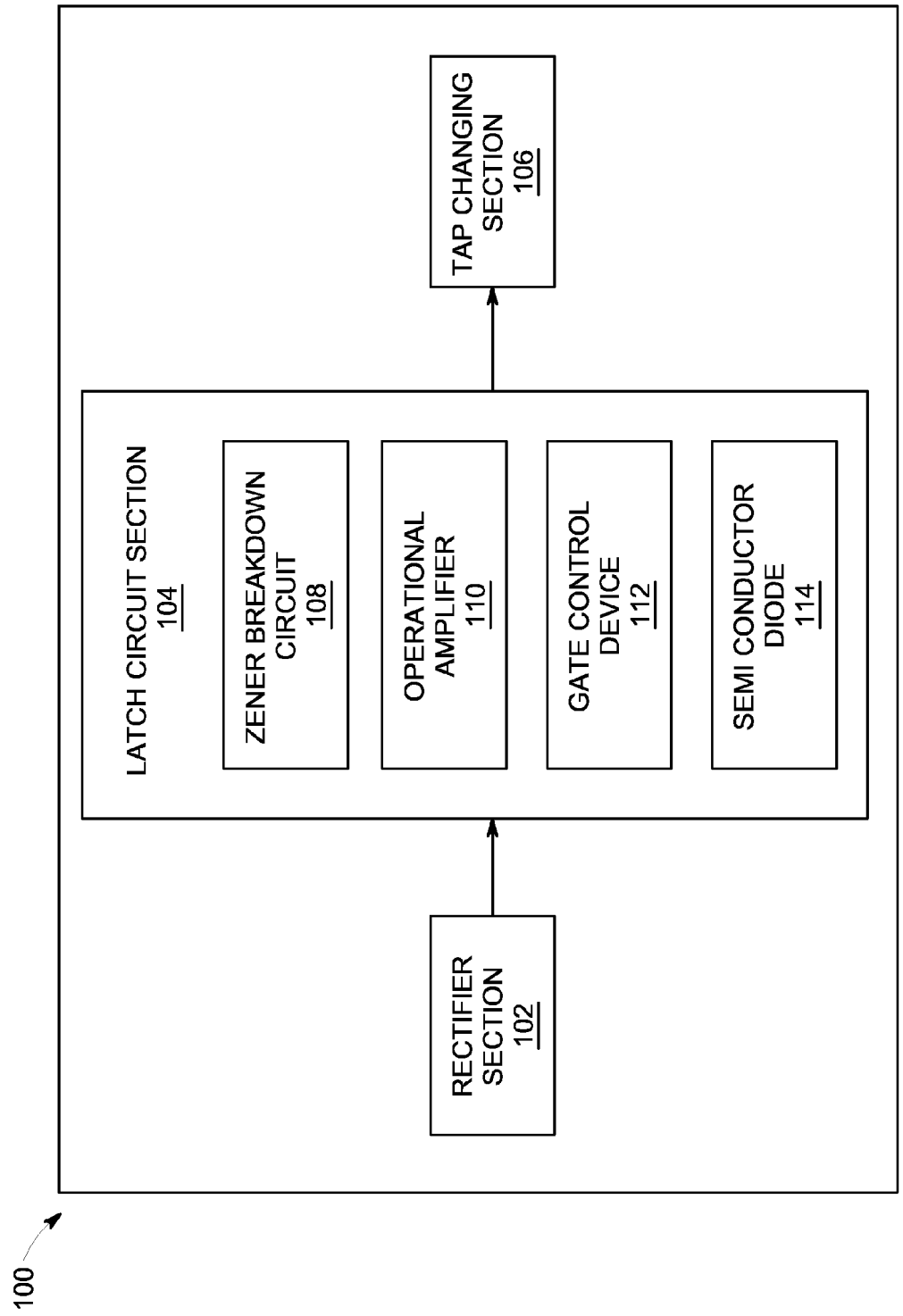
FIG. 1 shows a block diagram of a power supply as described in one embodiment.

Accordingly, in one embodiment, as shown in FIG. 1, a power supply 100 for a static tap changer transformer is provided. The power supply 100 comprises a rectifier section 102 configured to supply input voltage, a latch circuit section 104 coupled to the rectifier section 102, the latch circuit section 104 configured to latch on an overvoltage condition and a tap changing section 106 coupled to the latch circuit section 104.

The rectifier section 102 comprising a single-phase diode bridge full wave rectifier is configured to supply three phase input voltage to the power supply components.

The latch circuit section 104 comprises a zener breakdown circuit 108 with a selected breakdown voltage rating, an operational amplifier 110 configured to activate the latch circuit section 104 during the overvoltage condition when the input voltage is higher than the selected breakdown voltage, a gate control device 112 configured to generate a tap changing signal and thereby control the operation of the latch circuit section 104 and a semi-conductor diode 114 coupled to the gate control device 112 and the operational amplifier 110. The semiconductor diode 114 is configured to provide the tap changing signal to the operational amplifier 110.

The tap changing section 106 comprises three taps for each phase of the three phase input power supply. Further, each tap comprises a single MOSFET configured to act as a switch based on the output from the zener breakdown circuit 108 and the gate control device 112. Typically, MOSFETs turn ON and OFF based on the input power supply and output load regulation requirements. When one MOSFET of any phase turns ON, the MOSFETs in the other taps of the same phase see a reduced voltage corresponding to the inductive voltage drop across the windings that are present between the tapped points.

Figure 2:
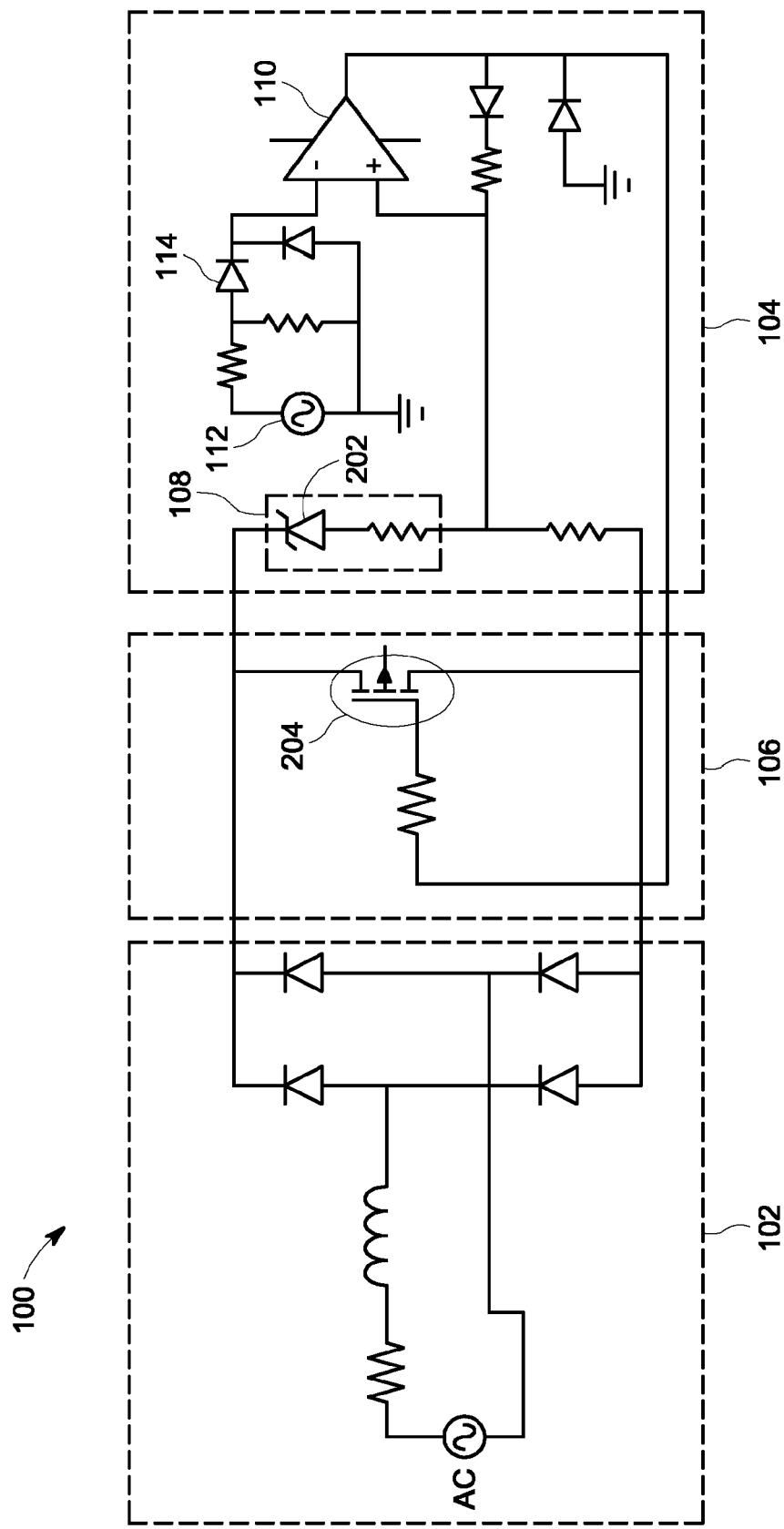
FIG. 2 shows a schematic circuit diagram of the power supply described in one embodiment.

FIG. 2 describes the front end schematic of the power supply 100, depicting the rectifier section 102 comprising the three phase input supply, the tap changing section 106 housing the MOSFETs 204 and the latch circuit section 104. The latch circuit section 104 operates under the dynamic conditions of start up and single-phase loss by using the zener breakdown circuit 108 that acts as a crowbar protection circuit. The drain to source terminal of the MOSFET 204 is connected across the zener breakdown circuit 108. The zener breakdown circuit 108 comprises a zener diode 202 with a selected breakdown voltage rating of about 125 volts with approximately 10% tolerance. The zener diode 202 is configured to conduct when the input voltage exceeds the selected breakdown voltage rating of the zener breakdown circuit 108. The voltage rating of the zener diode 202 ensures that zener breakdown, i.e., conduction of the zener diode 202, occurs at a maximum of 137 volts. Thus, the zener diode 202 clamps the gate of MOSFET 204 to a maximum of 137 volts for gate protection thereby fully protecting the power transistor of the MOSFET 204 from voltage spikes resulting from dynamic conditions. This ensures that the voltage rating of the MOSFET 204 of 150 volts is never exceeded.

Also, the zener diode 202 protects the zener breakdown circuit 108 from negative voltages greater than the avalanche breakdown voltage of the transistor of MOSFET 204. The avalanche rating of MOSFET 204 limits the maximum voltage applicable for a specified time. A resistor may also be used to provide an RC time constant or filter effect at the gate of MOSFET 204. This ensures that the input voltage noise will not discharge the gate voltage of MOSFET 204 under normal operation.

The operational amplifier 110 is used to latch on the overvoltage condition. The overvoltage condition indicates a condition when the input voltage exceeds the selected breakdown voltage rating of the zener breakdown circuit 108. The zener diode 202 in the zener breakdown circuit 108 breaks down and conducts during the overvoltage condition. The operational amplifier 110 comprises a positive input and a negative input. The positive input is fed with the output from the zener break down circuit 108 and with feedback from the output of the operational amplifier 110. The output of the operational amplifier 110 is fed back to ensure that the latch is set once the zener diode 202 has breakdown.

The gate control device 112 is configured to generate the tap changing signal to control the operation of the latch circuit section 104. The tap changing signal thus generated is capable of turning ON the MOSFET 204. The semiconductor diode 114 in the power supply 100 connects the output of the gate control device 112 to the negative input of the operational amplifier 110. This is done to reset the latch circuit section 104 once the tap changing signal to drive the MOSFET 204 comes in.

The latch circuit section 104 is activated when there is an overvoltage and unlatched once the gate drive signal comes in. Till that time the latch circuit section 104 drives the MOSFET 204 to which it is connected, ensuring the MOSFETs 204 in each phase of the three-phase input power supply are not exposed to over voltage. Further, when the tap changing signal comes in from the gate control device 112 to turn ON the MOSFET 204 for tap changing, the latch circuit section 104 is reset by the same signal.

Figure 3:
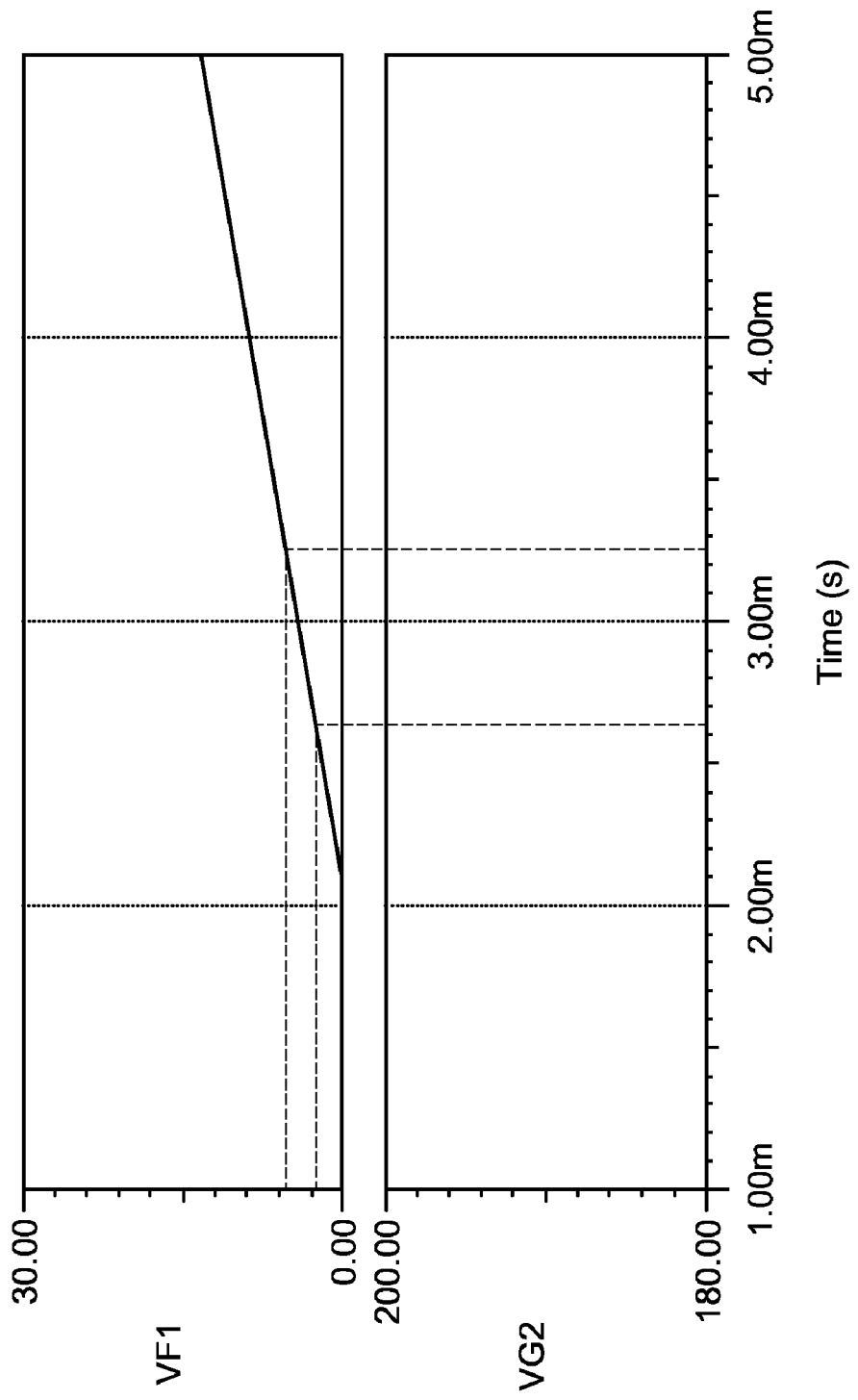
FIG. 3 shows graphical representation of the simulation results depicting the voltage across the MOSFET during initial start up conditions.

FIG. 3 shows graphical representation of the simulation results depicting the voltage across the MOSFET 204 during the initial start up condition in terms of its rate of rise of voltage. The time it takes to reach the threshold voltage for the gate to source voltage level indicates the time the MOSFET 204 will have to withstand the forward voltage of about 295 V across it. The sooner the gate driver reaches the threshold voltage, the lesser requirement is placed on the avalanche voltage specification of the MOSFET 204. In the result it is observed that the time taken to reach the threshold voltage for Vgs varies from approximately 0.6 ms to 1.3 ms depending upon the threshold voltage tolerance specified for the MOSFET 204. The simulation result for the time taken to reach the avalanche voltage rating indicates the MOSFET 204 forward voltage withstanding capability in terms of its avalanche characteristics. These results indicate that the MOSFET 204 is susceptible to failure if the design is solely based on its avalanche ratings.

The features mentioned above help to maintain the voltage level across the drain to source terminal of the MOSFET 204 to within 150 volts. During dynamic conditions, including start up and single phase loss, the latch circuit section 104 protects the MOSFETs 204, when the voltages of MOSFETs 204 extend beyond their ratings, by turning ON the MOSFETs 204 and thereby presenting a de rated power supply to the load without shutting down the power supply 100. This exhibits a minimal fault tolerant performance, eliminating system down time and thereby enabling continued scanning.

Figure 4:
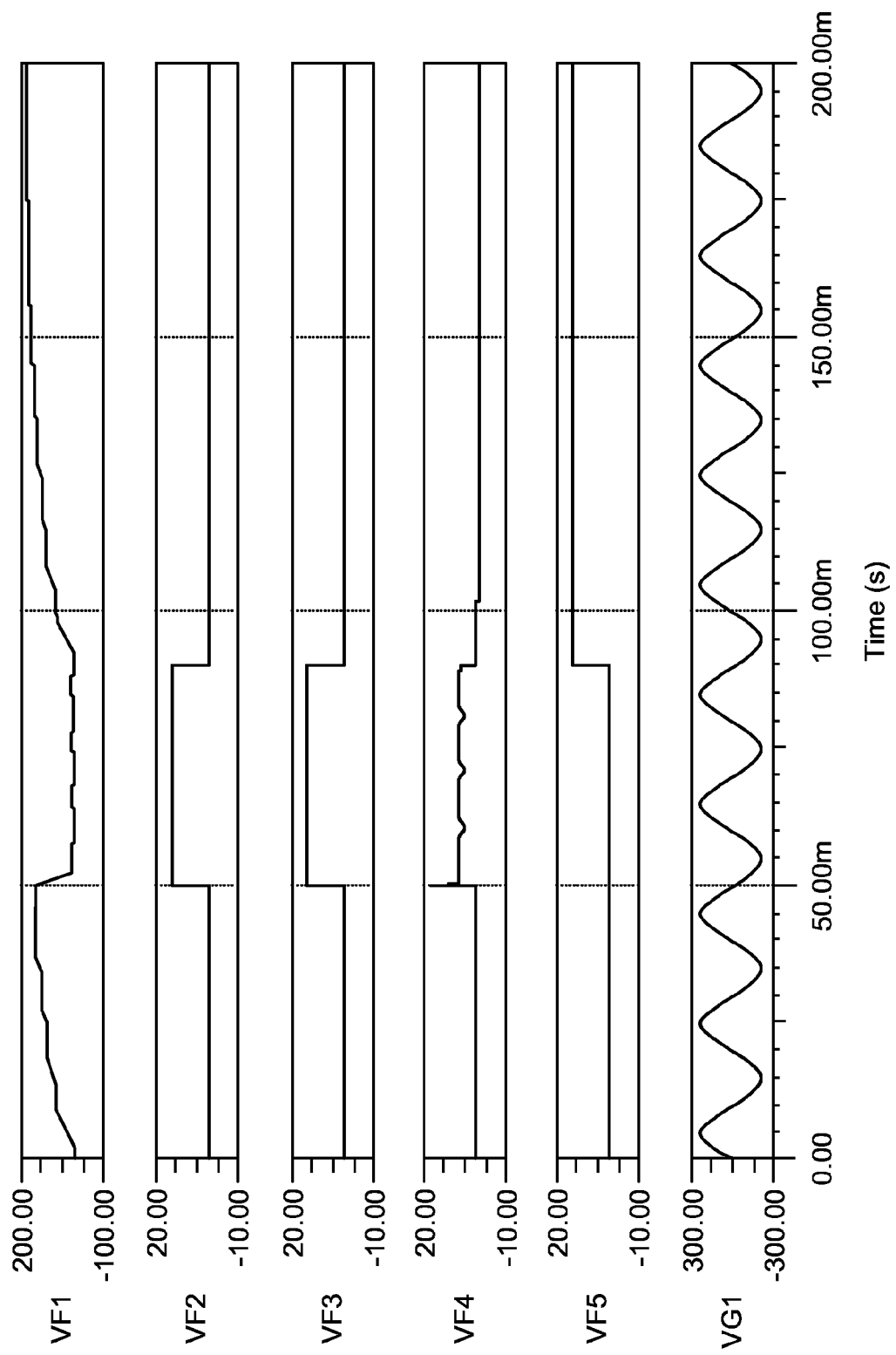
FIG. 4 shows graphical representation of the simulation result showing the effectiveness of the latch circuit section described in an embodiment.

FIG. 4 shows graphical representation of the simulation results depicting the effectiveness of latch circuit section 104. The voltage VF1 is the voltage across the drain to source terminals of the MOSFET 204 as shown in the simulation schematic. In this exemplary embodiment, initially the voltage reaches around 180 V. The voltage specification of the MOSFET 204 is approximately 150 V with a specified avalanche rating. This shows that the MOSFET 204 is expected to fail if the gate to source voltage does not come in, which can happen under conditions of dynamic startup and single phase loss. The voltage VF2 is the latch voltage. As soon as the latch circuit section 104 is switched ON, the overvoltage condition results in the zener breakdown. The zener breakdown voltage is passed to the input of the operational amplifier 110 shown in FIG. 2. The latch circuit section 104 ensures that the output of the operational amplifier 110 is latched on to the overvoltage condition. This condition continues till the voltage VF5, shown in FIG. 4, becomes high. The voltage VF5 represents a condition when the gate control device 112 gives the turn ON/tap change signal to the MOSFET 204 for it to turn ON. This being fed to the negative input of the operational amplifier 110 ensures that the latch circuit section 104 is de-latched or reset. Subsequent to this, the gate control device 112 will control the operation of the MOSFET 204.

Voltage across the three MOSFETs 204 in each phase is pulled down to the conduction level voltage, which is less than 5 volts, even when the gate control device 112 is OFF, which is the case under dynamic start up and faults conditions. Thus the power supply 100 ensures minimum fault tolerant operation under fault conditions.

The power supply 100 may be constructed using analog components or digital components or combination thereof. Further, though the embodiments are described with respect to a MOSFET, skilled artisans shall however appreciate that other electronic devices such as JFET and IGBT can as well be used.

As described in various embodiments, MOSFETs that see a voltage higher than the zener breakdown voltage are turned ON ensuring that the voltages across other MOSFETs are reduced to levels lower than their voltage specifications. If phase loss happens in a phase other than the phase that supplies control power to gate control device, that turns ON or turns OFF the MOSFET, the latch circuit section ensures minimal fault tolerance operation of the tap changing transformer under dynamic startup conditions and single phase loss conditions. This enables operation of the power supply under conditions of faults and prevents any downtime of MR system due to faults in the power supply.

The usage of the latch circuit section eliminates the need for overvoltage sensors and the overvoltage analog circuitry, since the latch circuit section prevents the drain to source terminals of the MOSFETs from experiencing higher voltage than the zener breakdown voltage.

The snubber circuit necessity is eliminated as the voltage across the drain to source terminals of the MOSFET is maintained well below its rated specification.

Embodiments of this invention eliminate the need to use MOSFETs with avalanche ratings, as normal rated MOSFETs are sufficient.

The power supply described herein facilitates using MOSFETs with comparatively less power dissipation capabilities. This is possible due to constraining the voltage across the drain to source terminals of the MOSFETs within limits.

In various embodiments of the invention, a power supply for a magnetic resonance imaging system and a magnetic resonance imaging system using the power supply are described. However, the embodiments are not limited and may be implemented in connection with different applications. The application of the invention can be extended to other areas, for example power systems. The invention provides a broad concept of using a static tap changing transformer in power supply units, which can be adapted in various gradient products and RF subsystems that desire to improve reliability, reduce costs and system downtime. The design can be carried further and implemented in various forms and specifications.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power supply for a static tap changer transformer comprising:
    a rectifier section configured to supply input voltage;
    a latch circuit section comprising:
        a zener breakdown circuit with a selected breakdown voltage rating;
        an operational amplifier configured to activate the latch circuit section when the input voltage is higher than the selected breakdown voltage;
        a gate control device configured to generate a tap changing signal and thereby control the operation of the latch circuit section; and
        a semi-conductor diode coupled to the gate control device and the operational amplifier, the semiconductor diode configured for providing the tap changing signal to the operational amplifier; and
    a tap changing section comprising three taps for each phase of three phase input power supply, wherein each tap comprises a single MOSFET configured to act as a switch based on the output from the zener breakdown circuit and the gate control device.

2. The power supply of claim 1, wherein the rectifier section comprises a single-phase diode bridge rectifier.

3. The power supply of claim 1, wherein the operational amplifier comprises a positive input and a negative input, the positive input being fed with an output from the zener breakdown circuit and a feedback from the output of the operational amplifier and the negative input being fed with the tap changing signal through the semiconductor diode.

4. The power supply of claim 1, wherein the zener breakdown circuit comprises a zener diode and the zener diode is configured to conduct when the input voltage exceeds the selected breakdown voltage rating of the zener breakdown circuit.

5. The power supply of claim 4, wherein the latch circuit section is set subsequent to the conduction of the zener diode.

6. The power supply of claim 5, wherein the latch circuit section is reset subsequent to the reception of the tap changing signal at the operational amplifier.

7. The power supply of claim 5, wherein the drain to source terminal of the MOSFET is connected across the zener breakdown circuit.

8. The power supply of claim 7, wherein the MOSFET is switched ON subsequent to the conduction of the zener diode.

9. An MRI system comprising a power supply, the power supply comprising:
    a latch circuit section comprising:
        a zener breakdown circuit with a selected breakdown voltage rating;
        an operational amplifier coupled to the zener breakdown circuit, the operational amplifier configured to latch on an overvoltage condition;
        a gate control device for supplying control power to the latch circuit section; and
        a semi-conductor diode coupled to the gate control device and the operational amplifier, the semi-conductor diode configured for providing the control power from the gate control device to the operational amplifier.

10. The MRI system of claim 9, further comprising a rectifier section configured to supply input voltage to the latch circuit section.

11. The MRI system of claim 10, wherein the rectifier section comprises a single-phase diode bridge rectifier.

12. The MRI system of claim 9, wherein the overvoltage condition indicates a condition where the input voltage exceeds the selected breakdown voltage rating of the zener breakdown circuit.

13. The MRI system of claim 12, wherein the zener breakdown circuit comprises a zener diode and wherein the overvoltage condition results in conduction of the zener diode.

14. The MRI system of claim 13, wherein the latch circuit section is set subsequent to the conduction of the zener diode.

15. The MRI system of claim 14, wherein the power supply further comprises a tap changing section comprising three taps for each phase of three phase input power supply and wherein each tap comprises a single MOSFET configured to act as a switch based on the output from the zener breakdown circuit and the gate control device.

16. The MRI system of claim 15, wherein the drain to source terminal of the MOSFET is connected across the zener breakdown circuit.

17. The MRI system of claim 15, wherein the MOSFET is switched ON subsequent to the conduction of the zener diode.

18. The MRI system of claim 9, wherein the gate control device is configured to generate a tap changing signal and thereby control the operation of the latch circuit section.

19. The MRI system of claim 18, wherein the latch circuit section is reset subsequent to the reception of the tap changing signal at the operational amplifier.

20. The MRI system of claim 9, wherein the operational amplifier comprises a positive input and a negative input, the positive input being fed with an output from the zener breakdown circuit and a feedback from the output of the operational amplifier and the negative input being fed with the tap changing signal through the semiconductor diode.

* * * * *